(12) United States Patent
Lin et al.

(10) Patent No.: US 6,306,772 B1
(45) Date of Patent: *Oct. 23, 2001

(54) DEEP TRENCH BOTTLE-SHAPED ETCHING USING CL$_2$ GAS

(75) Inventors: Ming-Horng Lin; Ray Lee; Nien-Yu Tsai, all of Hsinchu (TW)

(73) Assignees: ProMos Technology, Inc; Mosel Vitelic Inc, both of Hsinchu (TW); Siemens AG, Munich (DE)

( * ) Notice: Subject to any disclaimer, the term of this patent is extended or adjusted under 35 U.S.C. 154(b) by 0 days.

This patent is subject to a terminal disclaimer.

(21) Appl. No.: 09/552,024

(22) Filed: Apr. 19, 2000

(51) Int. Cl.[7] .................. H01L 21/302; H01L 21/461

(52) U.S. Cl. .................. 438/714; 438/700; 438/713; 438/735

(58) Field of Search ................. 438/700, 713, 438/714, 733, 734, 735

(56) References Cited

U.S. PATENT DOCUMENTS 6,071,823 * 6/2000 Hung et al. .

* cited by examiner

*Primary Examiner*—Kevin M. Picardat
*Assistant Examiner*—D. M. Collins
(74) *Attorney, Agent, or Firm*—W. Wayne Liauh

(57) ABSTRACT

A method to fabricate bottle-shaped deep trench into a semiconductor substrate. After a neck profile is formed, the chlorine gas at a predetermined flow rate is added to the etching plasma gas composition, while the flow rates of the plasma gases are increased by about 30% by volume, to create an enlarged lower portion of the deep trench. Preferably, the neck portion is etched using an etching composition which contains HBr, NF$_3$, and (He/O$_2$) provided at flow rates of about 87:13:35 sccm. The enlarged lower portion is etched using an etching composition which contains HBr, NF$_3$, and (He/O$_2$) provided at flow rates of about 113±12:17±2:46±5 sccm, and Cl$_2$ provided at a flow rate between 10 and 40 sccm. It was found that the width of the lower portion of the deep trench can be increased by 100% with minimum side effects such as polymer deposition in the plasma chamber, which could occur as result of substantially increased flow rate of HBr and/or NF$_3$.

20 Claims, 3 Drawing Sheets

DEEP TRENCH BOTTLE-SHAPED ETCHING USING CL$_2$ GAS

FIELD OF THE INVENTION

The present invention relates to an improved method for making sub-micron-sized semiconductor devices containing at least one deep-trench type capacitor. More specifically, the present invention relates to a method for fabricating into a semiconductor substrate one or more bottle-shaped deep trenches with an enlarged diameter, or more generally speaking, with enlarged circumference or cross-sectional area, at the lower portion thereof, with minimum polymer deposition problems on the plasma chamber wall. The method disclosed in the present invention increases the surface area and thus the capacitance of the capacitor that is formed around the side wall of the deep trench. However, unlike prior art techniques, the method disclosed in the present invention does not require the formation of a collar oxide nor the additional thermal oxidation step in order to form an oxide layer laterally into the substrate. However, as a further improvement over the prior method, the present invention also eliminates or at least minimizes the amount of polymer deposition that may disadvantageously occur inside the plasma chamber due, which could be caused by the use of certain etchants in order to enlarge the trench diameter.

BACKGROUND OF THE INVENTION

There are two basic types of capacitors provided in a semiconductor device, the crown-type capacitors and the deep-trench type capacitors. A capacitor comprises a dielectric layer sandwiched by a pair of spaced conducting plates. As the trend in the fabrication of semiconductor devices is toward ever-increasing density of circuit components that can be tightly packed per unit area, there are great demands to develop technologies that can reduce the surface area to be taken by individual circuit components. As a result, deep trench technologies have been developed which result in structures, particularly large area capacitors, that are vertically oriented with respect to the plane of the substrate surface.

A deep trench capacitor typically comprises a dielectric layer formed on the sidewalls of a deep trench, which is formed into and surrounded by a highly doped buried plate (which constitutes the first conducting plate), and a highly doped poly fill (which constitutes the second conducting plate), which fills the deep trench. The capacitance of the deep trench capacitor is determined by the total sidewall surface of the trench, which, in turn, is determined by the diameter, or more specifically the circumference, of the deep trench. As the semiconductor fabricating technology moves into the sub-micron or even deep sub-micron range, it is increasingly recognized that the present technology for making deep trench capacitors may be inadequate. For deep sub-micron semiconductor devices, a deep trench can have a length-to-diameter aspect ratio of 35:1 or even greater. With current technology, the diameter (or width or circumference) of the trench generally decreases with depth. Such a tapered cross-sectional area causes a significant decrease in the overall sidewall surface of the trench, and, consequently, the capacitance provided by the deep trench capacitor. This problem is expected to become even more profound as we move into the next generation of ULSI fabrication technologies that are characterized with critical dimensions of 0.15-micron or even finer.

To increase the capacitance of a semiconductor deep-trench capacitor, the so-called bottle-shaped deep trench has been proposed. In an article entitled "0.228 μm Trench Cell Technologies with Bottle-Shaped Capacitor for 1 Gbit DRAMs", by T. Ozaki, et al, IEDM, 95, PP661-664 (1995), the authors disclosed a method to increase the diameter of a deep trench. The method disclosed therein includes the steps of: (1) forming an 80 nm collar oxide at the upper portion of the trench by the selective oxidation; (2) performing a capacitor process which includes oxidation mask removal, native oxide removal, etc., during which process the collar oxide thickness reduces to 50 nm; and (3) in-situ phosphorous doped polysilicon is deposited and phosphorous doping into the trench side wall at the capacitor portion (plate electrode) is performed by the furnace annealing technology. The collar oxide prevents phosphorous doping at the upper portion of the trench; it also makes the electrical isolation between the plate electrode and the transfer transistor. The poly-silicon is removed by chemical dry etching and the diameter of the trench under the collar oxide is enlarged at the same time.

Since the method disclosed in Ozaki et al requires the additional steps of first forming a collar oxide followed by thermal oxidation of the substrate in the lower portion of the deep trench, it can substantially increase the manufacturing cost. In a co-pending application App. Ser. No. 09/399,825, the content thereof is incorporated herein by reference, it is disclosed an improved method for fabricating bottle-shaped deep trenches; however, if the amount (i.e., flow rate) of the HBr gas so used is too high, it may also undesirably cause polymeric material to be formed which is then deposited on chamber wall during the plasma etching process, causing cleaning up problems.

SUMMARY OF THE INVENTION

The primary object of the present invention is to develop a process for fabricating bottle-shaped deep trenches, which can be used in deep sub-micron deep trench type capacitors with an enhanced sidewall surface so that a capacitance of 40 pF or more can be attained, without substantially increasing the manufacturing cost. More specifically, the primary object of the present invention is to develop a method for enlarging the sidewall surface of a deep trench capacitor, by forming a bottle-shaped deep trench in the substrate, without substantially deviating from the conventional process, so as to obtain the maximum benefit under a controlled manufacturing cost. The present invention also relates to the semiconductors that are made from a process incorporating this method. The main difference between the present invention and the '825 invention is that the present invention prevents formation and accumulation of polymer deposits in the plasma chamber wall, thus eliminating the need for subsequent cleanup procedure.

Conventionally, deep trenches are formed into a substrate by an anisotropic plasma etching process using a plasma gas composition that comprises hydrogen bromide (HBr), nitrogen fluoride (NF$_3$), helium, and oxygen, at a predetermined ratio. In order to minimize the disparity in the trench width (i.e., diameter) from top to bottom, as well as not to substantially increase the width in the upper portion of the trench, the pressure of the plasma composition is increased midway during the anisotropic etching process, while maintaining the concentration of HBr and NF$_3$ constant. The underlying consideration for the conventional approach is to minimize the width degradation in forming a submicron deep trench; it was not considered to be possible to the use the same approach, even in a modified form, to fabricated bottle-shaped deep trenches.

In the '825 invention, it was discovered that the conventional approach can indeed be modified so that a bottle-shaped trench can be formed. The method disclosed in the present invention involves two substitute steps. First, the trench being formed is subject to a "shock" treatment at substantially increased concentrations of HBr and $NF_3$ (as opposed to constant HBr and $NF_3$ concentrations in the conventional process), but at about the same plasma pressure for a short duration. Then the concentrations of HBr and $NF_3$ are cut back, but the plasma pressure is substantially reduced (as opposed to substantially increased plasma gas pressure), in a subsequent substitute step. The second substitute step continues until the etching process is completed. One of the main advantages of the present invention is that a bottle-shaped deep trench can be formed with the same equipment and plasma etching components as the conventional method, thus eliminating the need for capital investments as well as other extra operational expenses that may be otherwise required.

However, it was discovered by the inventors of the present invention that the use of HBr at high concentrations (or actually high flow rates) without compensations from other co-etchants can cause polymers to build up and which are deposited on the plasma chamber wall. This becomes more profound if the process calls for a very high concentration of HBr than those used in the '825 invention.

The inventors unexpectedly discovered that, by adding $Cl_2$ gas in the traditional deep trench etching recipe which contains $NF_3$, HBr and $He/O_2$, a bottle-shaped deep trench profile can be obtained without the spikes in the HBr concentration relative to other etching components. One of the main advantages of the present invention is that, unlike the '825 process, the polymer deposition on the plasma chamber was substantially prevented, thus, allowing a clean chamber to be maintained. And the trench diameter can be increased almost 100% compared to those made from the conventional process.

BRIEF DESCRIPTION OF THE DRAWING

The present invention will be described in detail with reference to the drawing showing the preferred embodiment of the present invention, wherein:

FIG. 1 is a schematic drawing showing that a pad stacked dielectric layer and a photoresist pattern are formed on a substrate.

FIG. 2 is a schematic drawing showing that an opening is formed through the pad stacked layer by reactive ion etching or plasma etching techniques utilizing the photoresist layer.

FIG. 3 is a schematic drawing showing that a neck profile is formed in the substrate by subjecting the substrate to a second plasma etching process.

FIG. 4 is a schematic drawing showing that the slope of trench width decrease is substantially ameliorated by switching to a third plasma etching process at higher plasma gas pressure but the same plasma etching composition.

DETAILED DESCRIPTION OF THE PREFERRED EMBODIMENT

The present invention discloses a method for making deep sub-micron deep trench type capacitors with a bottle-shaped enhanced sidewall surface so that a capacitance of 40 pF or more can be attained. One of the main advantages of the present invention is that the bottle-shaped deep trench can be formed with the same equipment, essentially the same plasma components, and similar procedure, as the conventional method, thus eliminating the need for capital investments that may be otherwise required. Another main advantage of the present invention is that, while a high concentration of HBr was utilized during such plasma etching treatment no polymer deposition was found on the plasma chamber, and a clean chamber was maintained. This eliminates the need to have to regularly clean the chamber, and thus substantially improving the cost-effectiveness of this novel process for fabricating bottle-shaped deep trenches.

Conventionally, deep trenches are formed into a substrate by an anisotropic plasma etching process using a plasma gas composition that comprises hydrogen bromide (HBr), nitrogen fluoride ($NF_3$), helium, and oxygen, at a predetermined composition. In order to minimize the disparity in the trench width (i.e., diameter) from top to bottom, as well as not to substantially increase the width in the upper portion of the trench, the pressure of the plasma composition is increased midway during the anisotropic etching process, while the concentrations of the HBr, $NF_3$ and ($He/O_2$) components are maintained constant. A high plasma pressure increases the horizontal (or radial) etching rate relative to vertical etching rate, while the effect of the plasma etch on the already formed sidewall is minimized by maintaining the concentrations of HBr, $NF_3$ and ($He/O_2$) relatively constant. The main design consideration of the conventional approach is to contain the width degradation in the deep trench, it was not considered to be possible to form a bottle-shaped deep trench.

Figure 1:
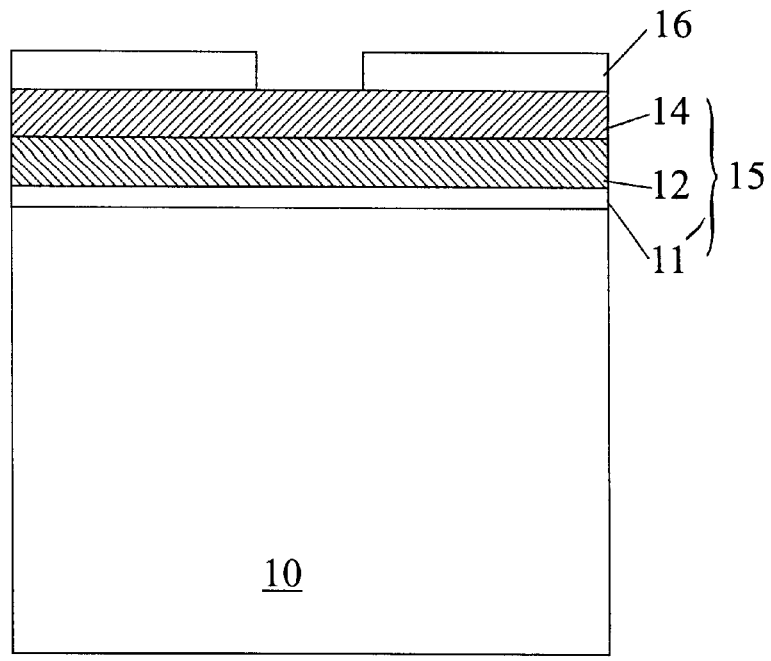
FIGS. 1 through 4 are schematic drawings showing the main steps in forming a deep trench according to an approach which is similar to the conventional approach.

FIGS. 1 through 4 are schematic drawings showing the main steps in forming a deep trench according to an approach that is similar to the conventional approach. In FIG. 1, it is shown that a pad stacked layer 15 is formed on a substrate 10. The pad stacked layer 15 typically consists of a pad oxide layer 11, a silicon nitride layer 12, and a dielectric boron silicate glass layer 14. The pad oxide layer 11 is provided mainly to improve the adhesion between the nitride layer and the silicon substrate, and to reduce thermal and mechanical stresses. FIG. 1 also shows a photoresist pattern 16 which is formed by a photolithography process.

Figure 2:
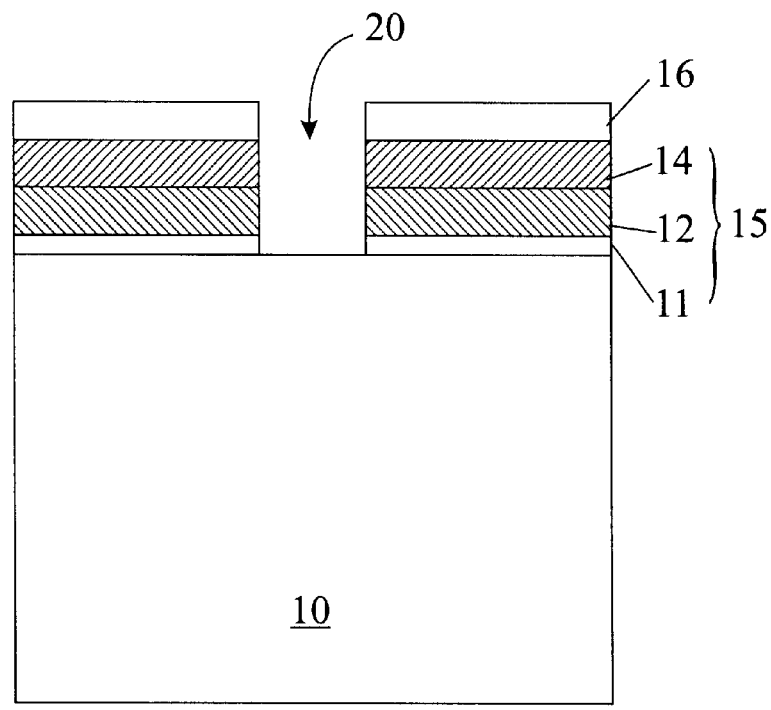

FIG. 2 shows that an opening 20 is formed through the pad stacked layer 15, by reactive ion etching or plasma etching techniques, utilizing the photoresist layer 16. After the photoresist layer is removed, the substrate is subject to a first plasma etching to remove a native oxide layer which may be formed due to the exposure of the silicon substrate to the outside environment. The first plasma etching, which is often called a "breakthrough" step, is conducted at a plasma gas pressure of about 20 to 50 mtorr, preferably 25 mtorr; an RF power of about 500 to 900 W, preferably at 600 W; and a magnetic field of about 10 to 40 Gauss, preferably at 15 Gauss. The plasma gas composition consists of HBr and $NF_3$ a at a ratio of about 20:5, expressed in terms of volumetric flow rate, sccm (standard cubic centimeters). The etching time is about 20 to 40 seconds, preferably 25 seconds. This step is described as the first plasma etching.

Figure 3:
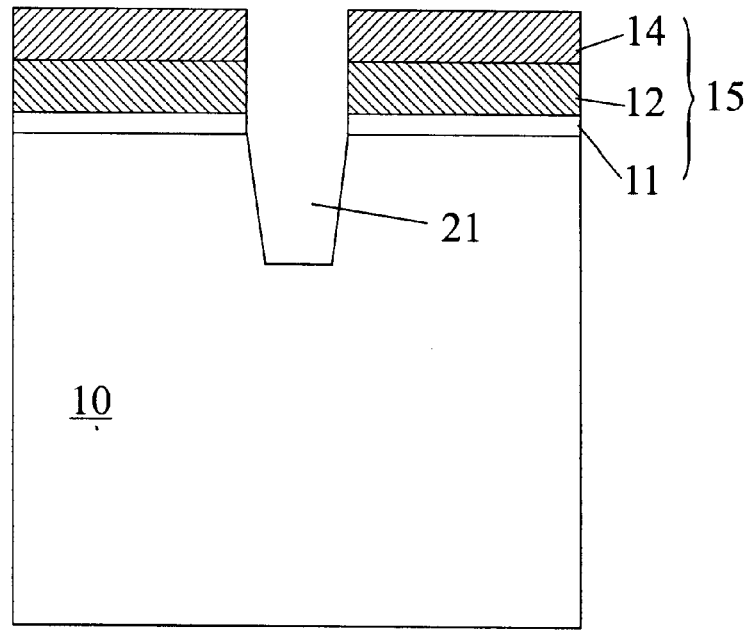

FIG. 3 shows that a neck profile is formed in the substrate by subjecting the substrate to a subsequent plasma etching process. The second plasma etching is conducted at a plasma gas pressure of about 80 to 110 mtorr, preferably 100 mtorr; an RF power of about 700 to 900 W, preferably at 800 W: and a magnetic field of about 80 to 110 Gauss, preferably at 100 Gauss. The plasma gas composition consists of HBr, NF$_3$, and (He/O$_2$) at a flow rate (sccm) ratio of about 87:13:35. The ratio between He and O$_2$ is about 70%: 30% in the (He/O$_2$) mixture. The etching time is about 90 to 110 seconds, preferably 95 seconds. FIG. 3 shows a tapered neck profile, which constitutes the upper portion of the deep trench 21. This step is described as the second plasma etching.

Figure 4:
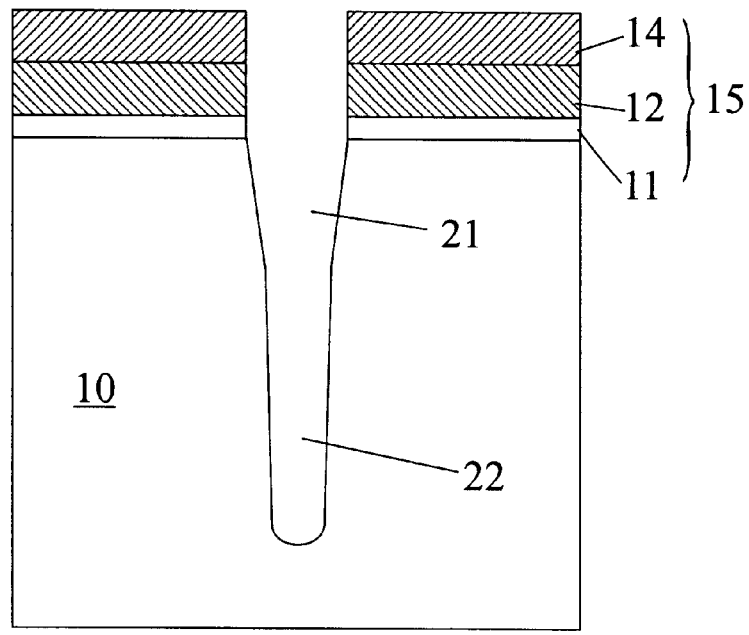
Figure 5:
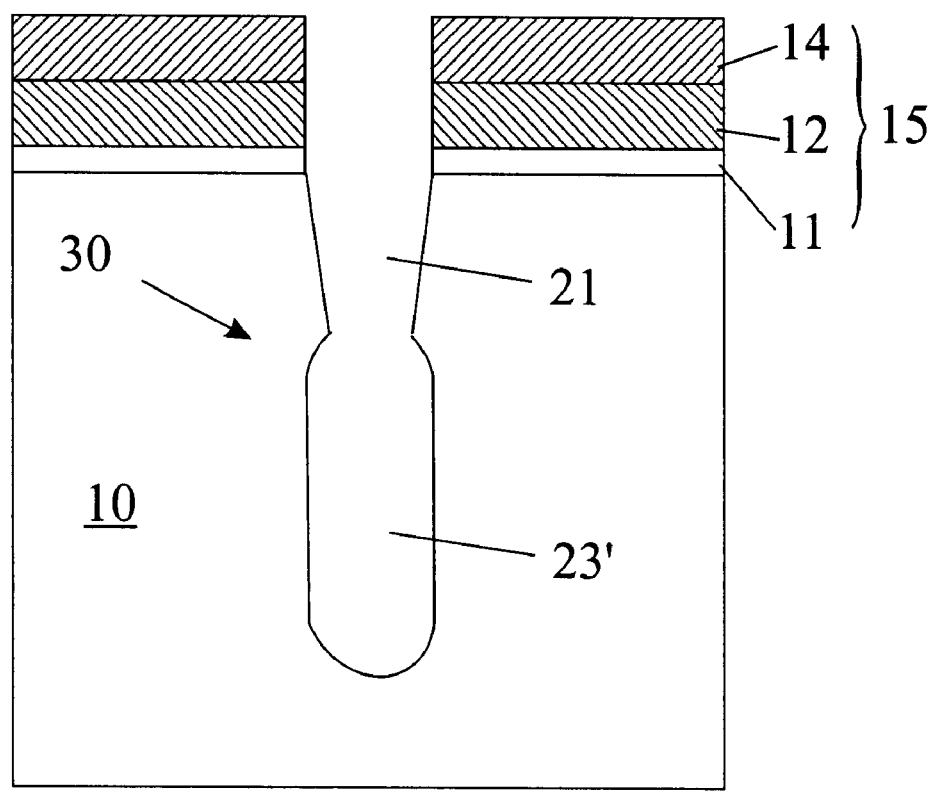
FIG. 5 is a schematic drawing showing that, instead of following the step described in FIG. 4, a bottle-shaped trench is formed using the novel plasma etching composition of the present invention, which involves increasing the flow rate of the plasma gas and adding chlorine gas to the plasma gas composition.

In order to arrest the sharp degradation in the width of the trench as the plasma etching further progresses, the prior art approach calls for an increase in the plasma gas pressure from between 80 to 110 mtorr, to about 110 to 130 mtorr, preferably at 125 mtorr, while maintaining other conditions, including the plasma etching gas composition, substantially the same. The etching time is about 450 to 500 seconds, preferably 485 seconds. The result is shown in FIG. 4, which indicates that the slope of trench width decrease is substantially ameliorated. However, the width of the entire lower portion 22 of the trench is narrower than the narrowest width in the upper portion. This step is described as the third plasma etching.

With the method disclosed in the present invention, which involves a different process to replace the third plasma etching step of the conventional process, the trench is first subject to the first and second substitute plasma etching steps as in the conventional approach. Thereafter, the flow rates of HBr, NF$_3$, and (He/O$_2$) are increased by 20 to 40%, preferably 30%, to about 113±12 :17±2:46±5 (in sccm). The ratio between He and O$_2$ is the same at about 70% :30% in the (He/O$_2$) mixture. Increasing the flow rates of HBr and NF$_3$ increases the etching rate in the radial direction; however, this effect is suppressed by the increased flow rate of the (He/O$_2$) mixture. Increasing the flow rates of HBr and NF$_3$ alone could cause polymer deposition problems. In the present invention, unexpected results were observed that, when chlorine gas was further added to the etching gas stream at the increased flow rate, a bottle-shaped deep trench can be obtained. This is achieved with minimum polymer deposition in the plasma chamber.

The third plasma etching step is conducted at a plasma gas pressure of about 110 to 130 mtorr, preferably 125 mtorr; an RF power of about 600 to 1,000 W, preferably at 1,000 W; and a magnetic field of about 40 to 55 Gauss, preferably at 55 Gauss. Unlike the process disclosed in the '825 invention, no spikes in the HBr flow rate is needed relative to other etching components. This prevents polymer deposition on the plasma chamber wall.

The present invention will now be described more specifically with reference to the following examples. It is to be noted that the following descriptions of examples, including the preferred embodiment of this invention, are presented herein for purposes of illustration and description, and are not intended to be exhaustive or to limit the invention to the precise form disclosed.

EXAMPLE 1

A pad stacked layer 15, which consists of a pad oxide layer 11, a silicon nitride layer 12, and a dielectric boron silicate glass layer 14 is formed on a substrate 10, as shown in FIG. 1, via chemical vapor deposition. A photoresist pattern 16 is then formed by a photolithography process on the pad stacked layer 15.

An opening 20 is formed through the pad stacked layer 15, by plasma etching technique, utilizing the photoresist layer 16, as shown in FIG. 2. After the photoresist layer is removed, the substrate is subject to a first (or breakthrough) plasma etching to remove a native oxide layer which may be formed due to the exposure of the silicon substrate to the outside environment. The first plasma etching process is conducted at a plasma gas pressure of 25 mtorr, an RF power of 600 W, and a magnetic field of 15 Gauss. The plasma gas composition consists of HBr and NF$_3$ a at a ratio of about 20:5. The numbers in the ratio indicate the gas flow rates, in sccm. The etching time is 25 seconds.

The substrate is then subjected to a second plasma etching step to form a neck profile 21 as shown in FIG. 3. The second plasma etching is conducted at a plasma gas pressure of 100 mtorr, an RF power of 800 W, and a magnetic field of 100 Gauss. The plasma gas composition consists of HBr, NF$_3$, and (He/O$_2$) a at a ratio of about 87:13:35. The ratio between He and O$_2$ is about 70% :30%. The etching time is 95 seconds.

In order to increase the width of the deep trench to form a bottle shape, the substrate is now subjected to a third plasma etching step wherein the flow rates of HBr, NF$_3$, and (He/O$_2$) were respectively increased by 30% to 113:17:46 (in sccm), and a chlorine gas (Cl$_2$) was added to the etching gas stream at a rate of 10 sccm. The ratio between He and O$_2$ was maintained the same at about 70%:30% in the (He/O$_2$) mixture. The third plasma etching step was conducted at a plasma gas pressure of 120 mtorr, an RF power of 1000 W, and a magnetic field of 50 Gauss.

By increasing the flow rates of HBr, NF$_3$, and (He/O$_2$) and including the chlorine gas (Cl$_2$) at 10 sccm, the width of the deep trench was increased to 213 μm. No observable polymer deposit was found in the plasma etching chamber. The trench depth was measured at a location about 1.5 μm from the trench bottom. This appeared to correspond to the location with the largest trench width.

EXAMPLES 2–3

The procedures in Examples 2–3 were identical to that in Example 1, except that the flow rate of the chlorine gas (Cl$_2$) was increased to 25 sccm and 40 sccm, respectively. The widths of the deep trench was measured to be 296 μm and 333 μm, respectively.

Comparative Example 1

The procedures in Comparative Example 1 was identical to that in Example 1, except that no chlorine gas (Cl$_2$) added to the plasma etching gas stream. The width of the deep trench was measured to be 160 μm.

The foregoing description of the preferred embodiments of this invention has been presented for purposes of illustration and description. Obvious modifications or variations are possible in light of the above teaching. The embodiments were chosen and described to provide the best illustration of the principles of this invention and its practical application to thereby enable those skilled in the art to utilize the invention in various embodiments and with various modifications as are suited to the particular use contemplated. All such modifications and variations are within the scope of the present invention as determined by the appended claims when interpreted in accordance with the breadth to which they are fairly, legally, and equitably entitled.

What is claimed is:

1. A method for forming a deep trench in a semiconductor substrate, comprising the steps of:
   (a) forming a pad stacked layer on a substrate;
   (b) forming a through hole in said pad stacked layer using a photolithography process;

(c) performing a second plasma etching process to form an upper trench section in said substrate, said second plasma etching process being performed using a second etching composition which comprises HBr, NF$_3$, and a mixture of He and O$_2$ at a second predetermined set of flow rates; and (d) performing a third plasma etching process to form a width-enlarged trench section in said substrate below said upper trench section, said third plasma etching process being performed using a third etching composition which comprises HBr, NF$_3$, Cl$_2$, and a mixture of He and O$_2$ at a third predetermined set of flow rates.

2. The method for forming a deep trench in a semiconductor substrate according to claim 1 wherein said pad stacked layer comprises a nitride layer and a dielectric glass layer.

3. The method for forming a deep trench in a semiconductor substrate according to claim 1 which further comprises a first plasma etching process using a first etching composition prior to said second plasma etching process to remove a native oxide layer that may be formed when said through hole is formed.

4. The method for forming a deep trench in a semiconductor substrate according to claim 1 wherein said Cl$_2$ gas is provided at a flow rate greater than 10 standard cubic centimeters (sccm).

5. The method for forming a deep trench in a semiconductor substrate according to claim 1 wherein said Cl$_2$ gas is provided at a flow rate between 10 and 40 sccm.

6. The method for forming a deep trench in a semiconductor substrate according to claim 1 wherein the flow rates of said HBr, NF$_3$, and said mixture of He and O$_2$ in said third etching process are about 20 to 40% greater than those in said second etching process.

7. The method for forming a deep trench in a semiconductor substrate according to claim 1 wherein the flow rates of said HBr, NF$_3$, and said mixture of He and O$_2$ in said third etching process are about 30% greater than those in said second etching process.

8. The method for forming a deep trench in a semiconductor substrate according to claim 1 wherein said (He/O$_2$) mixture has ratio between He and O$_2$ of about 70%:30%.

9. The method for forming a deep trench in a semiconductor substrate according to claim 1 wherein said HBr, NF$_3$, and (He/O$_2$) are provided at flow rates of about 87:13:35 sccm in said second etching process.

10. The method for forming a deep trench in a semiconductor substrate according to claim 1 wherein said HBr, NF$_3$, and (He/O$_2$) are provided at flow rates of about 113±12:17±2:46±5 sccm in said third etching process.

11. A method for forming a deep trench in a semiconductor substrate, comprising the steps of:

(a) forming a pad stacked layer on a substrate;

(b) forming a through hole in said pad stacked layer using a photolithography process;

(c) performing a second plasma etching process to form an upper trench section in said substrate, said second plasma etching process being performed using a second etching composition at a second predetermined set of flow rates; and (d) performing a third plasma etching process to form a width-enlarged trench section in said substrate below said upper trench section, said third plasma etching process being performed using a third etching composition which comprises Cl$_2$ at a third predetermined set of flow rates.

12. The method for forming a deep trench in a semiconductor substrate according to claim 11 wherein said pad stacked layer comprises a nitride layer and a dielectric glass layer.

13. The method for forming a deep trench in a semiconductor substrate according to claim 11 which further comprises a first plasma etching process using a first etching composition prior to said second plasma etching process to remove a native oxide layer that may be formed when said through hole is formed.

14. The method for forming a deep trench in a semiconductor substrate according to claim 11 wherein said Cl$_2$ gas is provided at a flow rate greater than 10 standard cubic centimeters (sccm).

15. The method for forming a deep trench in a semiconductor substrate according to claim 11 wherein said Cl$_2$ gas is provided at a flow rate between 10 and 40 sccm.

16. The method for forming a deep trench in a semiconductor substrate according to claim 11 wherein both said second and third etching compositions comprise HBr, NF$_3$, and a mixture of He and O$_2$, and the flow rates of said HBr, NF$_3$, and said mixture of He and O$_2$ in said third etching process are about 20 to 40% greater than those in said second etching process.

17. The method for forming a deep trench in a semiconductor substrate according to claim 1 wherein both said second and third etching compositions comprise HBr, NF$_3$, and a mixture of He and O$_2$, and the flow rates of said HBr, NF$_3$, and said mixture of He and O$_2$ in said third etching process are about 30% greater than those in said second etching process.

18. The method for forming a deep trench in a semiconductor substrate according to claim 11 wherein said both said second and third etching compositions contain a (He/O$_2$) mixture having ratio between He and O$_2$ of about 70%:30%.

19. The method for forming a deep trench in a semiconductor substrate according to claim 11 wherein said second etching composition contains HBr, NF$_3$, and (He/O$_2$) which are provided at flow rates of about 87:13:35 sccm in said second etching process.

20. The method for forming a deep trench in a semiconductor substrate according to claim 11 wherein said third etching composition contains HBr, NF$_3$, and (He/O$_2$) which are provided at flow rates of about 113±12:17±2:46±5 sccm in said third etching process.

* * * * *